United States Patent
Bonges, III et al.

(10) Patent No.: US 7,120,887 B2
(45) Date of Patent: Oct. 10, 2006

(54) CLONED AND ORIGINAL CIRCUIT SHAPE MERGING

(75) Inventors: Henry A. Bonges, III, Milton, VT (US); Michael S. Gray, Fairfax, VT (US); Jason D. Hibbeler, Williston, VT (US); Kevin W. McCullen, Essex Junction, VT (US); Robert F. Walker, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 10/707,845

(22) Filed: Jan. 16, 2004

(65) Prior Publication Data
US 2005/0160390 A1   Jul. 21, 2005

(51) Int. Cl.
*G06F 17/50* (2006.01)
(52) U.S. Cl. .................... 716/10; 716/4; 716/5; 716/11
(58) Field of Classification Search ............... 716/2–6, 716/8–12, 14, 18, 19, 21; 703/22; 250/492.22; 438/14
See application file for complete search history.

(56) References Cited

U.S. PATENT DOCUMENTS

| | | | | |
|---|---|---|---|---|
| 4,120,583 | A | * | 10/1978 | Hyatt .......................... 355/86 |
| 5,281,558 | A | * | 1/1994 | Bamji et al. .................... 716/2 |
| 5,498,579 | A | * | 3/1996 | Borodovsky et al. ......... 716/19 |
| 5,526,279 | A | | 6/1996 | Dick |
| 5,610,828 | A | * | 3/1997 | Kodosky et al. .............. 716/11 |
| 5,745,374 | A | | 4/1998 | Matsumoto |
| 5,923,562 | A | | 7/1999 | Liebmann et al. |
| 6,006,024 | A | * | 12/1999 | Guruswamy et al. ......... 716/12 |
| 6,011,911 | A | * | 1/2000 | Ho et al. ....................... 716/5 |
| 6,064,806 | A | * | 5/2000 | Lakos et al. ................... 716/3 |
| 6,083,275 | A | | 7/2000 | Heng et al. |
| 6,091,072 | A | * | 7/2000 | Dick et al. ............. 250/492.22 |
| 6,189,132 | B1 | | 2/2001 | Heng et al. |
| 6,189,133 | B1 | * | 2/2001 | Durham et al. ............... 716/12 |
| 6,209,123 | B1 | * | 3/2001 | Maziasz et al. ............... 716/14 |
| 6,214,494 | B1 | * | 4/2001 | Bula et al. ..................... 430/5 |
| 6,341,366 | B1 | * | 1/2002 | Wang et al. .................. 716/11 |

(Continued)

OTHER PUBLICATIONS

Varadarajan et al., "Cloning techniques for hierarchical compaction", Nov. 8-12, 1992, IEEE/ACM International Conference on, pp. 158-161.*

(Continued)

*Primary Examiner*—Jack Chiang
*Assistant Examiner*—Helen Rossoshek
(74) *Attorney, Agent, or Firm*—Richard M. Kotulak; Hoffman, Warnick & D'Alessandro LLC (57) ABSTRACT

A method, system and program product for merging cloned and original circuit shapes such that a union thereof does not include a notch. The invention determines, for a cell including an original circuit shape and at least one overlapping clone of the original circuit shape, whether each clone corner point of each overlapping clone is within a threshold distance of a corresponding original corner point of the original circuit shape; and generates, in the case that each clone corner point of each overlapping clone circuit shape is within a threshold distance, a union of each overlapping clone and the original circuit shape such that the union does not contain a notch. The union is generated using a point code that sets a new position for a union corner point to remove a notch based on the original shape's direction and the edge orientations previous to and next to the corner point.

20 Claims, 9 Drawing Sheets

U.S. PATENT DOCUMENTS

| | | |
|---|---|---|
| 6,351,841 B1 | 2/2002 | Tickle |
| 6,374,395 B1 * | 4/2002 | Wang .......................... 716/11 |
| 6,453,445 B1 | 9/2002 | Kuhn et al. |
| 6,453,447 B1 | 9/2002 | Gardner et al. |
| 6,463,403 B1 | 10/2002 | Burdorf et al. |
| 6,480,993 B1 * | 11/2002 | Suto et al. .................... 716/10 |
| 6,578,190 B1 * | 6/2003 | Ferguson et al. ............. 716/21 |
| 6,584,599 B1 | 6/2003 | Fujii |
| 6,587,992 B1 | 7/2003 | Marple |
| 6,620,561 B1 * | 9/2003 | Winder et al. ................. 430/5 |
| 6,756,242 B1 * | 6/2004 | Regan ......................... 438/14 |
| 6,795,951 B1 * | 9/2004 | Hathaway et al. ............. 716/5 |
| 6,904,575 B1 * | 6/2005 | Allen et al. .................... 716/4 |
| 6,983,440 B1 * | 1/2006 | Nequist ....................... 716/11 |
| 7,000,208 B1 * | 2/2006 | Zhang ......................... 716/11 |
| 2002/0032895 A1 * | 3/2002 | Narita .......................... 716/6 |
| 2004/0177329 A1 * | 9/2004 | Kasperkobitz ................. 716/3 |
| 2005/0132320 A1 * | 6/2005 | Allen et al. ................... 716/18 |
| 2005/0246674 A1 * | 11/2005 | Scheffer ........................ 716/8 |
| 2005/0246675 A1 * | 11/2005 | Scheffer ........................ 716/8 |
| 2005/0262463 A1 * | 11/2005 | Cohn et al. ................... 716/10 |
| 2005/0278676 A1 * | 12/2005 | Dhanwada et al. ............ 716/9 |
| 2006/0031055 A1 * | 2/2006 | Sheehan ...................... 703/14 |

OTHER PUBLICATIONS

"Migratable Library Generation," IBM Technical Disclosure Bulletin, vol. 40, No. 01, Jan. 1997, pp. 229-230.

* cited by examiner

FIG. 13

CLONED AND ORIGINAL CIRCUIT SHAPE MERGING

BACKGROUND OF INVENTION

1. Technical Field

The present invention relates generally to circuit design, and more particularly, to a method, system and program product for merging cloned and original circuit shapes.

2. Related Art

Figure 1:
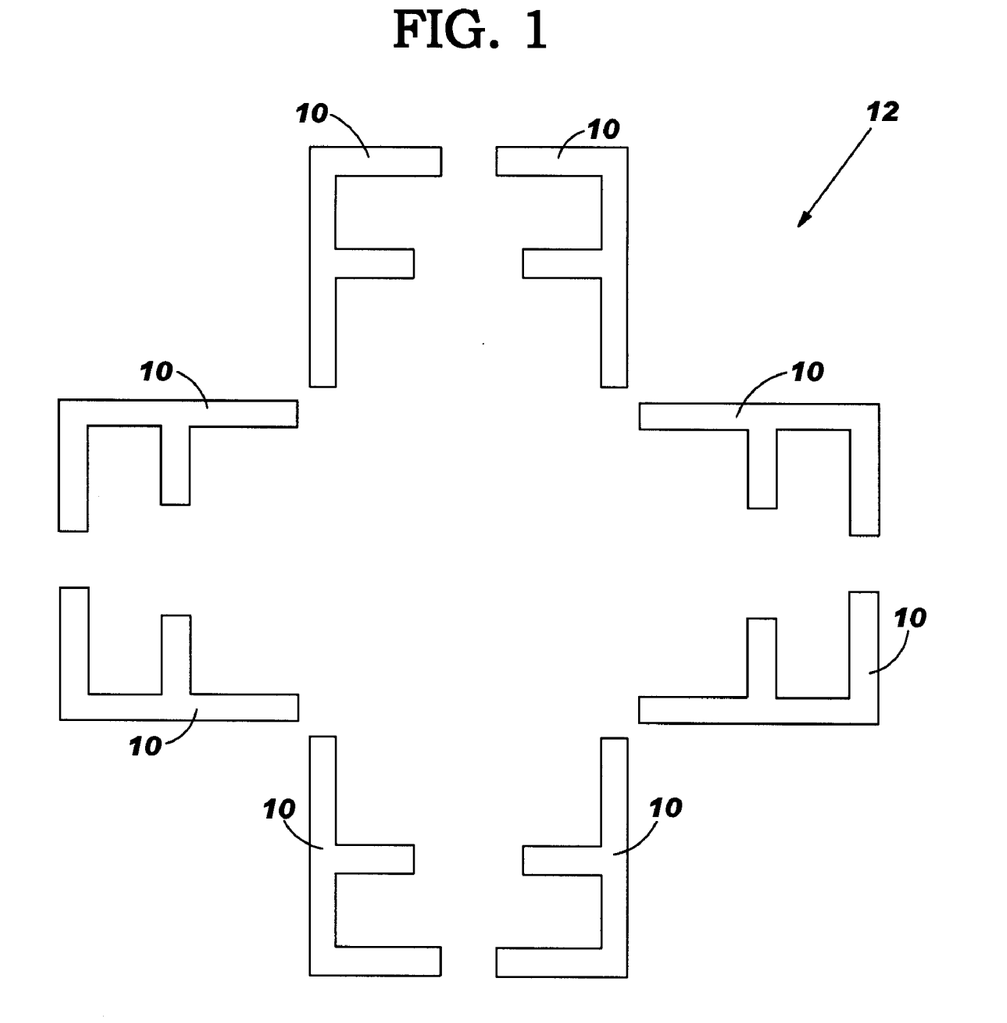
FIG. 1 shows an illustrative set of "F" shaped elements in the 8 possible sub-circuit orientations.
Figure 2:
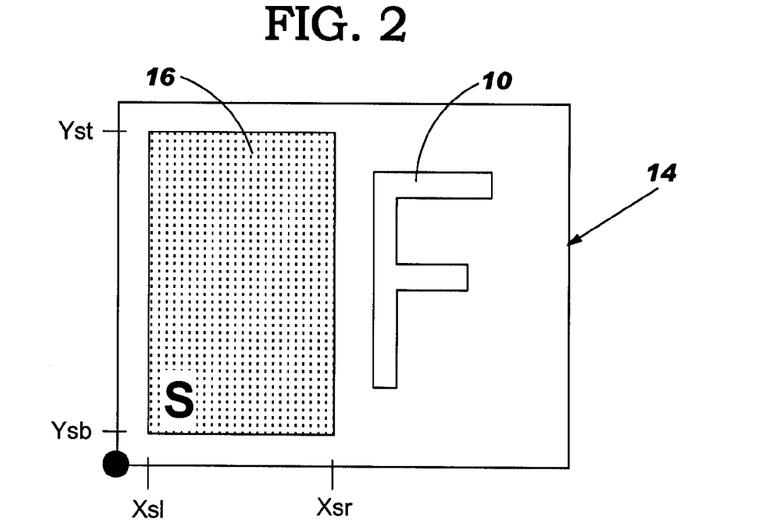
FIG. 2 shows an illustrative sub-circuit with a circuit shape.

Hierarchical technology migration is an integral part of integrated circuit (IC) design methodologies and design optimization. One challenge with migration is addressing multiple orientations of identical sub-circuits within a single design. For example, FIG. 1 shows the eight (8) possible orientations for an "F" shaped element 10 of an IC design 12. Some implementations of hierarchical technology migration cannot handle situations where a sub-circuit exists in multiple orientations simultaneously. For example, most implementations cannot handle situations where a sub-circuit exists in rotated and non-rotated forms. The restrictions arise because it may be necessary to move a single shape in different directions due to the orientations of the owning sub-circuit. The algorithms required to handle these cases can either require "sum constraints" or they cause X and Y variables to become entangled, preventing one-dimensional optimization of the problem. FIG. 2 shows a sub-circuit 14 including an F-shaped element 10 and another circuit shape 16 (also labeled S) that will be used to describe the potential problems. Each shape 16 includes a left edge Xsl, a right edge Xsr, a top edge Yst and a bottom edge Ysb.

Figure 3:
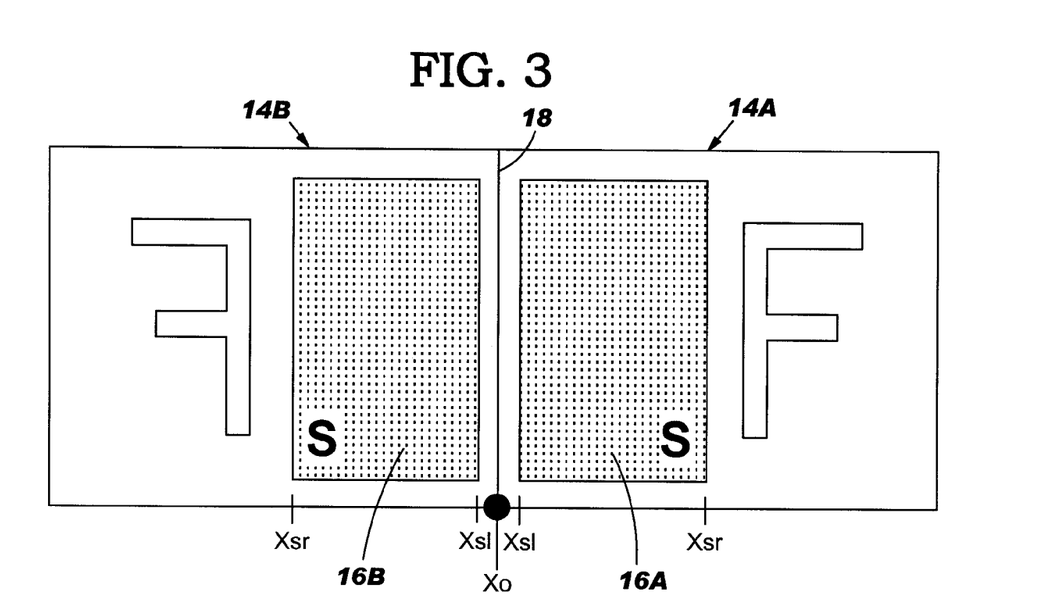
FIG. 3 shows a placement of the sub-circuit of FIG. 2 next to a mirror-image clone of the same sub-circuit.

With regard to sum constraints, FIG. 3 shows two sub-circuits 14A, 14B that are placed such that they are adjacent one another. That is, one sub-circuit 14A, and another 14B, mirrored about the Y-axis 18. Sub-circuits 14A, 14B are located at an origin Xo. In this example, a circuit shape 16B of sub-circuit 14B that is close to the boundary of sub-circuit 14B has a spacing constraint applied to it. The spacing constraint may be, for example, a minimum separation distance (G) required between shapes 16A and 16B, within two sub-circuits 14A, 14B. Edge Xsl (the leftmost edge of a circuit shape 16 as shown in FIG. 2) is located at Xo+Xsl for sub-circuit 14A and Xo−Xsl for sub-circuit 14B. These two edges must be separated by more than minimum separation distance G. Accordingly, the following equations must be met:

$$Xo+Xsl-(Xo-Xsl)>G$$

$$Xo+Xsl-Xo+Xsl>G$$

$$Xsl+Xsl>G.$$

These equations represent a "sum constraint" that cannot be solved by some solution techniques used in technology migration because they can only handle equations which are the difference of two variables.

Figure 4:
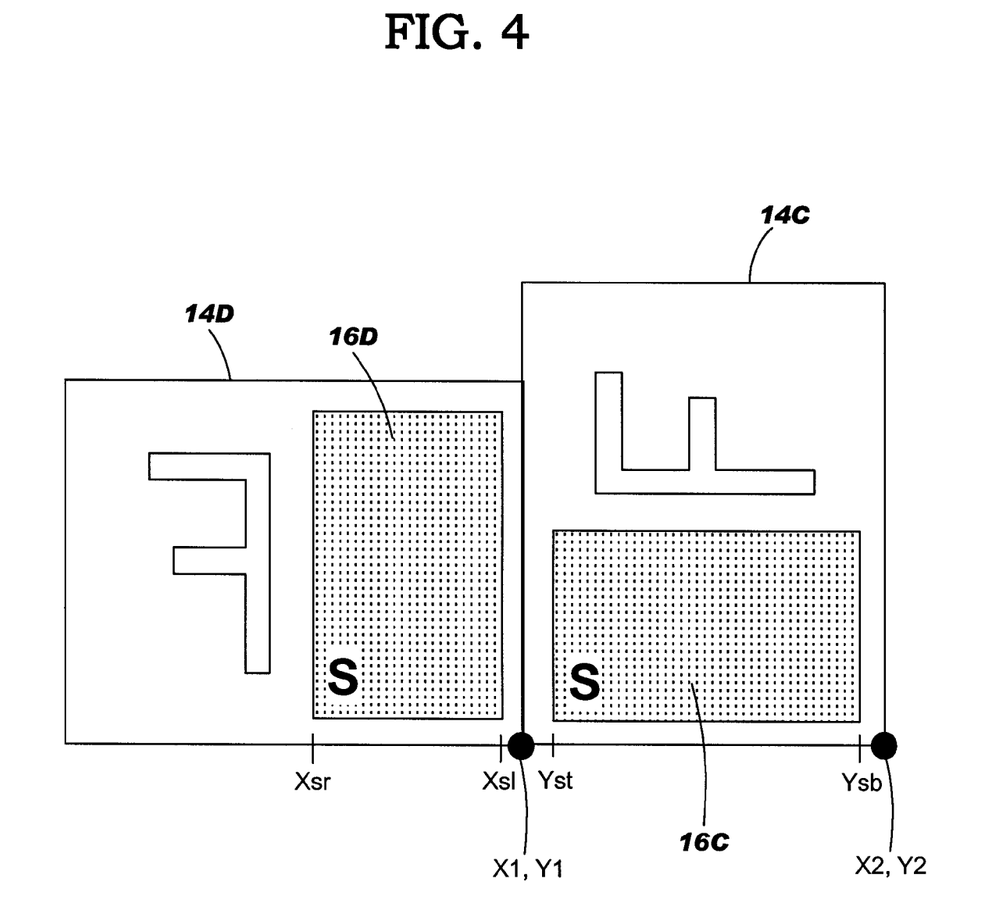
FIG. 4 shows a placement of the sub-circuit of FIG. 2 next to a 90° rotated clone of the same sub-circuit.

FIG. 4 illustrates a 9° rotation of a sub-circuit 14C relative to a sub-circuit 14D, which has caused a swapping of the X and Y directions of movement for sub-circuit 14C. In particular, there are two origin placements for the sub-circuits 14D, 14C: one at X1, Y1 and another at X2, Y2, respectively. As a result of the rotation, minimal separation distance G is now applicable between a left edge Xsl of circuit shape 16D and a top edge Yst of circuit shape 16C. Accordingly, the following equations must be met:

$$X2-Yst-(X1-Xsl)>=G$$

$$X2-Yst-X1+Xsl>=G.$$

Since this constraint contains both X and Y values, it cannot be solved by one-dimensional technology migration methods.

In order to address the above-identified problems, clones of sub-circuits are created. The clones of a sub-circuit 14 are copies of the sub-circuit in all of the used orientations of the sub-circuit, e.g., as shown for F-shaped element 10 in FIG. 1. The clones are substituted in the hierarchy for the mirrored and rotated copies of sub-circuit 14, and this modified hierarchy is migrated. In this case, the original sub-circuit 14 may have been copied into as many as seven (7) additional sub-circuits, each representing a unique orientation. Unfortunately, cloning results in an increase in data volume. That is, the cloning into as many as seven (7) additional sub-circuits results in the worst case in a 7× increase in data volume. In addition, any manual design change that needs to be made to a sub-circuit must be made to all of its clones, which makes it more difficult for designers to deal with the post-migrated data. Furthermore, certain checking programs might not be able to handle these clones.

Figure 5:
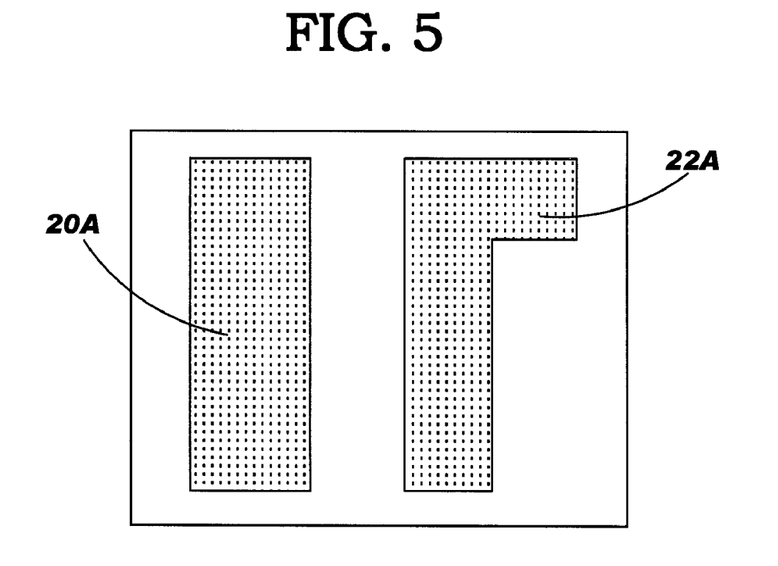
FIG. 5 shows an illustrative pair of original circuit shapes.
Figure 6:
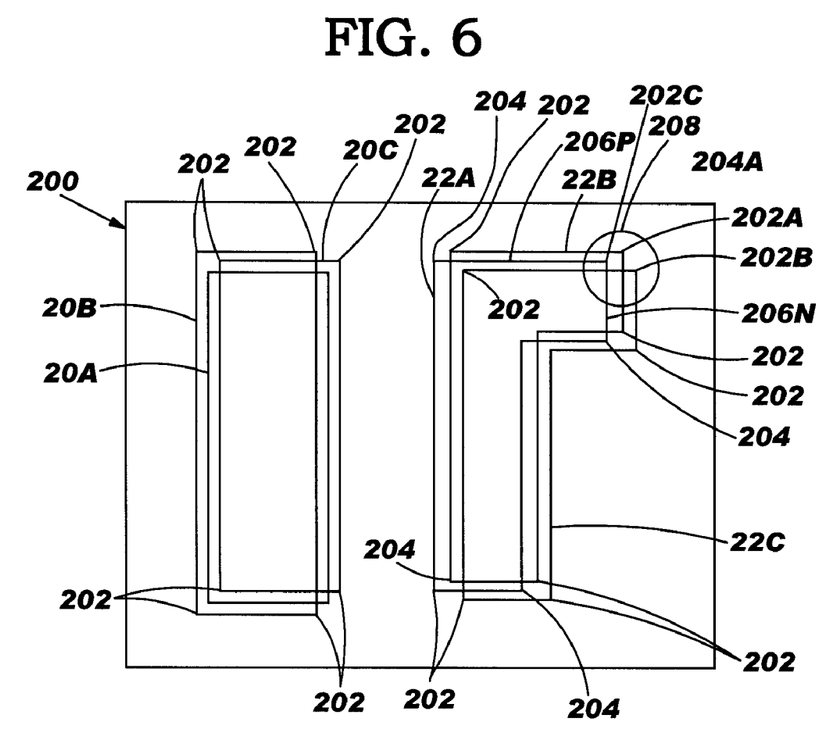
FIG. 6 shows the original circuit shapes of FIG. 5 and a number of overlapping clones of each.

In order to minimize the impact of the cloning, it is desirable to combine the clones back into the original circuit shape, where possible, to form a single circuit shape. However, generating a single circuit shape that encompasses the original and clones is difficult due to slight differences that are created between the original and clone. FIG. 5 shows an illustrative rectangular 20A and upside-down L 22A original circuit shapes, and FIG. 6 shows overlapping clones 20B, 20C of rectangular circuit shape 20A, and overlapping clones 22B, 22C of upside-down L circuit shape 22A. The slight differences are caused by the differences in each clones" respective environment (e.g., the shapes surrounding each copy) and round-off errors caused by conversions between floating point and integer representations of shape, edge and circuit locations. In particular, when data is scaled, the coordinates of edges, which are integers, are multiplied by a scaling factor that is a floating point. The resulting floating point number must be converted back to an integer. Within a hierarchy, the location at each level of the hierarchy is subjected to this conversion, as is the final shape position within the cell, i.e., lowest hierarchy level. At each of these levels, there is a rounding taking place. These roundings may push edges one grid point in opposite directions, i.e., one may round up and one may round down, resulting in a mis-registration of two grid points. In addition, each of the clones has differing neighboring shapes, which may result in the clone's shapes needing to move differently when compared with the other clones. As a result, the original cannot be substituted for the clones without creating ground rule errors.

Figure 7:
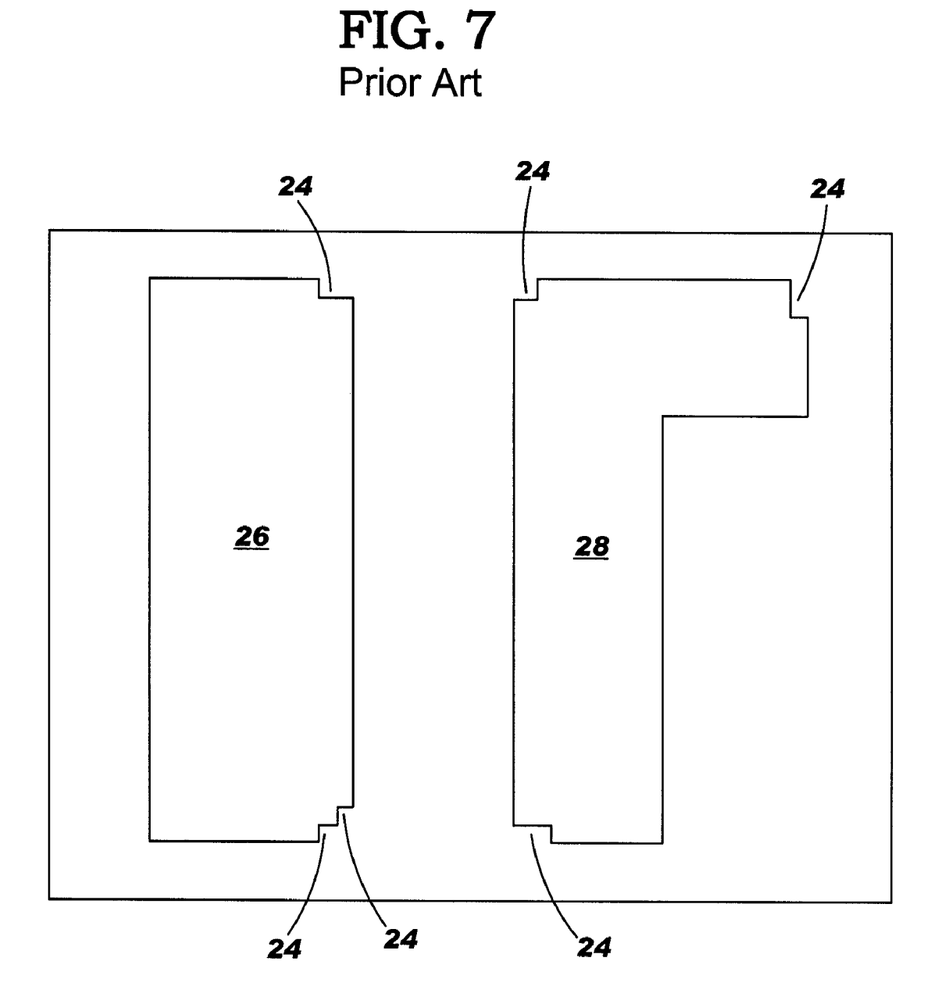
FIG. 7 shows the merger of the original circuit shapes and clones of FIG. 6 according to a prior art method.

When all of the slightly different clones and original circuit are combined in a straightforward manner, the minor differences cause notches in the merged circuit shapes that are illegal. FIG. 7 illustrates a combining of rectangular circuit shapes 20A, 20B, 20C into rectangular shape 26 and upside-down L circuit shapes 22A, 22B, 22C into upside-down L shape 28 according to a straightforward one-dimensional method. Note the introduction of notches 24 into the shapes. These notches are the result of mis-registration, instances where the shapes were moved a small distance from their original location. These notches are undesirable and most likely are illegal.

In view of the foregoing, there is a need in the art for an improved method, system and program product for merging cloned and original circuit shapes.

SUMMARY OF INVENTION

The present invention provides a method, system and program product for merging cloned and original circuit shapes such that union of the shapes does not include a notch. The invention determines, for a cell including an original circuit shape and at least one overlapping clone of the original circuit shape, whether each corner point of each overlapping clone is within a threshold distance of a corresponding original corner point of the original circuit shape; and generates, in the case that each corner point of each overlapping clone circuit shape is within a threshold distance, a union of each overlapping clone and the original circuit shape such that the union does not contain a notch. The union is generated using a point code that sets a new position for a union corner point to remove a notch based on the original shape's direction and the edge orientations previous to and next to the clone corner point.

A first aspect of the invention is directed to a method for merging an original circuit shape and at least one overlapping clone of the original circuit shape of an IC design, the method comprising the steps of: determining, for a cell including an original circuit shape and at least one overlapping clone of the original circuit shape, whether each clone corner point of each overlapping clone is within a threshold distance of a corresponding original corner point of the original circuit shape; and generating, in the case that each clone corner point of each overlapping clone is within the threshold distance, a union of each overlapping clone and the original circuit shape such that the union does not contain a notch.

A second aspect of the invention is directed to a system for merging an original circuit shape and at least one clone of the original circuit shape of an IC design, the system comprising: means for determining, for a cell including an original circuit shape and at least one overlapping clone of the original circuit shape, whether each clone corner point of each overlapping clone is within a threshold distance of a corresponding original corner point of the original circuit shape; and means for generating, in the case that each clone corner point of each overlapping clone is within the threshold distance, a union of each overlapping clone and the original circuit shape such that the union does not contain a notch.

A third aspect of the invention is directed to a computer program product comprising a computer useable medium having computer readable program code embodied therein for merging an original circuit shape and at least one clone of the original circuit shape of an IC design, the program product comprising: program code configured to determine, for a cell including an original circuit shape and at least one overlapping clone of the original circuit shape, whether each clone corner point of each overlapping clone is within a threshold distance of a corresponding original corner point of the original circuit shape; and program code configured to generate, in the case that each clone corner point of each overlapping clone is within the threshold distance, a union of each overlapping clone and the original circuit shape such that the union does not contain a notch.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

With reference to the accompanying drawings, FIG. 6 shows overlapping clones 20B, 20C of rectangular circuit shape 20A, and overlapping clones 22B, 22C of upside-down L circuit shape 22A that will be used to describe the invention. For purposes of description, only the upside-down L shape on the right side of FIG. 6 will be described in detail. It should be recognized, however, that the invention is applicable to one or more sets of an original circuit shapes and associated clones. It should also be recognized that any number of overlapping clones 22B, 22C may be generated and handled according to the following description.

As used herein, an "original corner point" refers to a point at the junction of two edges of an original circuit shape 22A. An "original circuit shape" is an as-designed shape of a circuit that is copied into one or more "clones," as described above. In one embodiment, each clone 22B, 22C has the same number of vertices as original circuit shape 22A (and accordingly, the same number of edges); and the edges have the same shape direction and order. These facts simplify the processes described below but are not limitations. In particular, shapes that do not meet these criteria can easily be reoriented to have a matching order and orientation. As also used herein, a "clone corner point" refers to a point that is a copy of an associated original corner point. Accordingly, a clone corner point may be at an identical position as an original corner point or offset therefrom. A "corresponding original corner point" is an original corner point that is copied to form the clone corner point at issue. Together, an original corner point and each of its corresponding clone corner points make up a "corner point set." A "union corner point" is a point that is used to form a corner of a union of an original circuit shape 22A and its clones 22B, 22C, and that is generated, as will be described below, from one or more of an original corner point 202A and clone corner point(s) 202B, 202C.

Figure 8:
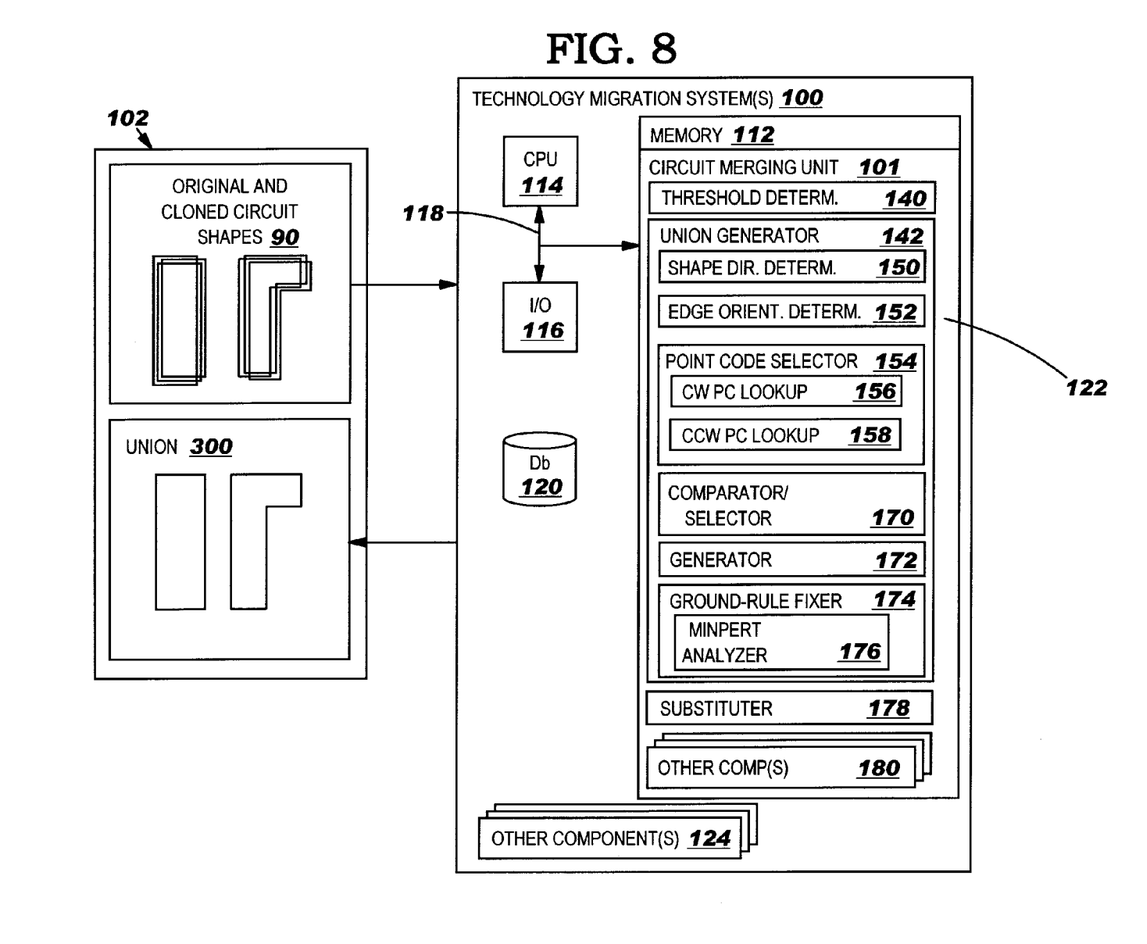
FIG. 8 shows a block diagram of a technology migration system including a circuit merging unit according to the invention.

With reference to FIG. 8, a block diagram of a technology migration system 100 (hereinafter "migration system") including a circuit-merging unit 101 in accordance with the invention is shown. Migration system 100 includes a memory 112, a central processing unit (CPU) 114, input/output devices (I/O) 116 and a bus 118. A database 120 may also be provided for storage of data relative to processing tasks. Memory 112 includes a program product 122 that, when executed by CPU 114, comprises various functional capabilities described in further detail below. Memory 112 (and database 120) may comprise any known type of data storage system and/or transmission media, including magnetic media, optical media, random access memory (RAM), read only memory (ROM), a data object, etc. Moreover, memory 112 (and database 120) may reside at a single physical location comprising one or more types of data storage, or be distributed across a plurality of physical systems. CPU 114 may likewise comprise a single processing unit, or a plurality of processing units distributed across one or more locations. I/O 116 may comprise any known type of input/output device including a network system, modem, keyboard, mouse, scanner, voice recognition system, CRT, printer, disc drives, etc. Other components 124, such as cache memory, communication systems, system software, etc., may also be incorporated into system 100. Other components 124 may also include any other now known or later developed functions of a technology migration system.

As shown in FIG. 8, migration system 100 may interact or be configured to operate as part of a larger circuit design system 102. Design system 102 provides an original circuit shape and one or more overlapping clones 90 to be migrated, and receives a union 300 of original circuit shape and overlapping clone(s) 90. Program product 122 includes, inter alia, circuit merging unit 101. Circuit merging unit 101 includes a threshold determinator 140 and a union generator 142. Union generator 142 includes a shape direction determinator 150; an edge orientation determinator 152; a point code selector 154 including a clockwise (CW) point code (PC) lookup 156 and a counter-clockwise (CCW) point code (PC) lookup 158; a comparator/selector 170; a generator 172; a ground-rule fixer 174 including a minimum perturbation (minpert) analyzer 176; a subsituter 178 and other components 180. The function of the above-stated components will be described below. Other components 180 may include any other hardware or software necessary to achieve circuit merging unit 101 functioning not distinctly described herein. It should be recognized that while circuit merging unit 101 has been shown as part of migration system 100, unit 101 can be provided as a stand alone system.

Figure 9:
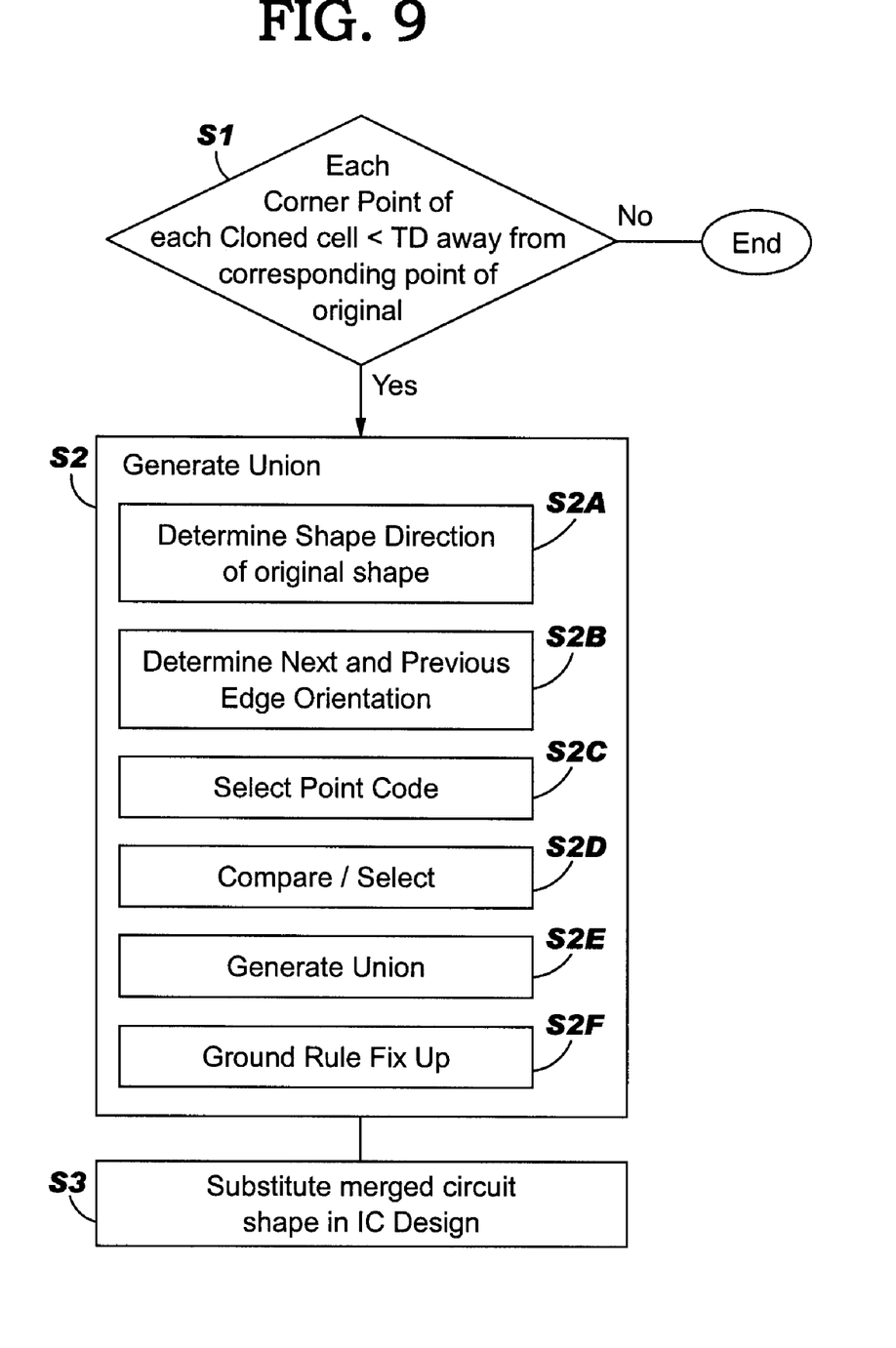
FIG. 9 shows a flow diagram of operation methodology of the circuit merging unit of FIG. 8.
Figure 10:
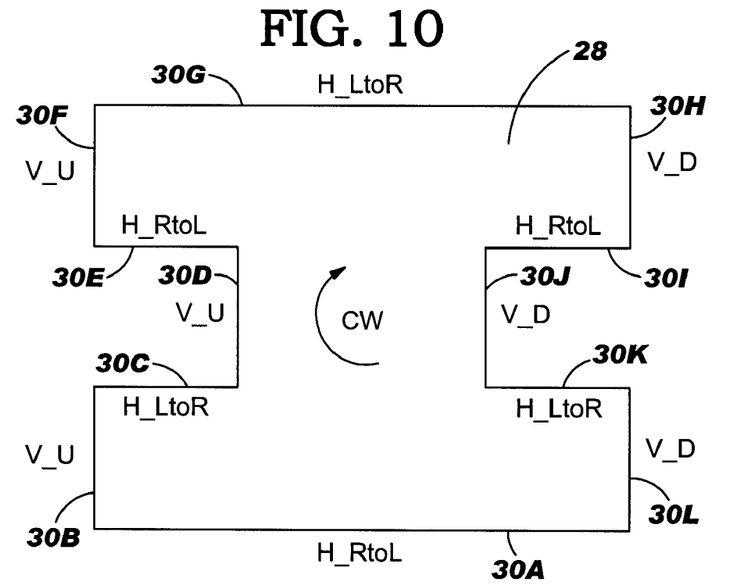
FIG. 10 shows a legend for determining an edge orientation for a circuit shape having a clockwise shape direction.

Turning to FIG. 9, in conjunction with FIGS. 6 and 8–13, operation methodology of circuit merging unit 101 will now be described.

In a first step S1, for a cell 200 (FIG. 6) including, for example, an original circuit shape 22A and at least one overlapping clone 22B, 22C of original circuit shape 22A, a determination is made by threshold determinator 140 (FIG. 8) as to whether each clone corner point 202 of each corner point set 208 (indicated with circle) is within a threshold distance (TD) of a corresponding original corner point 204.

The "threshold distance" may be any distance horizontal, vertical and/or a combination thereof beyond which merger of the circuit shapes (original and clone(s)) is not advisable. The threshold distance may be user-defined. In one embodiment, the threshold distance may be set to assure that, at a minimum, clones 22B, 22C overlap respective original circuit shape 22A. Referring to FIG. 6, if, for example, a clone corner point 202A of clone 22C was greater than TD away from a corresponding original corner point 204 of original shape 22A, then merger of circuit shapes for that cell would not be completed. Otherwise, processing proceeds to step S2.

In step S2, a union 300 (FIG. 13) of each overlapping clone 22B, 22C and original circuit shape 22A is generated such that union 300 does not contain a notch 24 (FIG. 7). A "notch" is a set of small edges at a corner of a shape, which reflect the mis-registered corners of the shapes that were unioned to form this shape. By definition, these edges will be smaller than the threshold distance. Step S2 includes a number of sub-steps as follows: In step S2A, a shape direction of original circuit shape 20A (FIG. 6) is determined by shape direction determinator 150 (FIG. 8). A "shape direction" indicates a direction in which parts of the shape, e.g., edges, are laid out during processing. In one embodiment, the shape direction may be determined by an order in which points appear in a construction list for the IC design. In order to illustrate the above-mentioned embodiment, FIG. 10 includes a sideways H circuit shape 28 that includes a number of edges 30A–30L. Circuit shape 30 is denoted as having a clockwise (CW) shape direction because a construction list for the IC design would generate the shape starting with, for example, edge 30A, followed by edge 30B, then 30C, and so on, until edge 30L. In contrast, FIG. 11 includes the same sideways H circuit shape 28 but is denoted as having a counter-clockwise (CCW) shape direction because a construction list for the IC design would generate the shape starting with, for example, edge 30L, followed by edge 30K, then 30J, and so on, until edge 30A. For purposes of description, original circuit shape 22A will be assumed to be have a clockwise shape direction.

Figure 11:
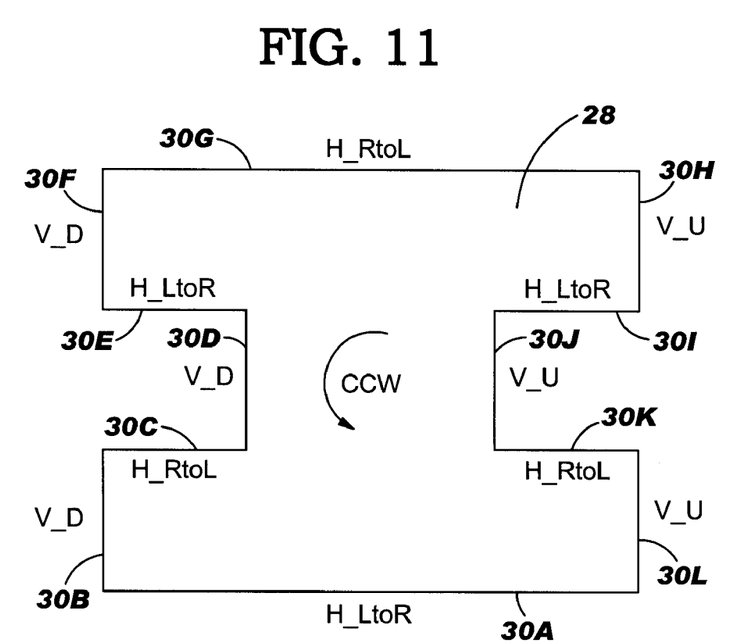
FIG. 11 shows a legend for determining an edge orientation for a circuit shape having a counter-clockwise shape direction.

Next, in step S2B, for each clone corner point, e.g., 202A (FIG. 6), of each overlapping clone 22B, 22C that is not identical to a corresponding original corner point, i.e., 204A, of original circuit shape 22A, a previous edge orientation and a next edge orientation is determined by edge orientation determinator 152 (FIG. 8). Returning to FIG. 10, "edge orientation" denotes whether the edge is vertical or horizontal and which direction the edge is formed in. The direction that an edge is formed in depends on the shape direction of the circuit shape, i.e., clockwise or counter-clockwise. In one embodiment, there are four possible edge orientations: horizontal left-to-right (H_LtoR); horizontal right-to-left (H_RtoL); vertical up (V_U) and vertical down (V_D). Relative to shape 28 in FIG. 10, edges 30A, 30E, 301 are H_RtoL; edges 30B, 30D and 30F are V_U; edge 30C, 30G and 30K are H_LtoR; and edges 30H, 30J and 30K are V_D. In contrast, if shape 28 has a counter-clockwise shape direction, as shown in FIG. 11, edges 30A, 30E, 301 are H_LtoR; edges 30B, 30D and 30F are V_D; edge 30C, 30G and 30K are H_RtoL; and edges 30H, 30J and 30K are V_U. Returning to FIG. 6, for original corner point 204A of original shape 22A (again assuming clockwise shape direction), the previous edge for original corner point 204A would be edge 206P and the next edge would be edge 206N. As a result, original corner point 204A has a previous edge (206P) orientation H_LtoR, and a next edge (206N) orientation V_D.

Figure 13:
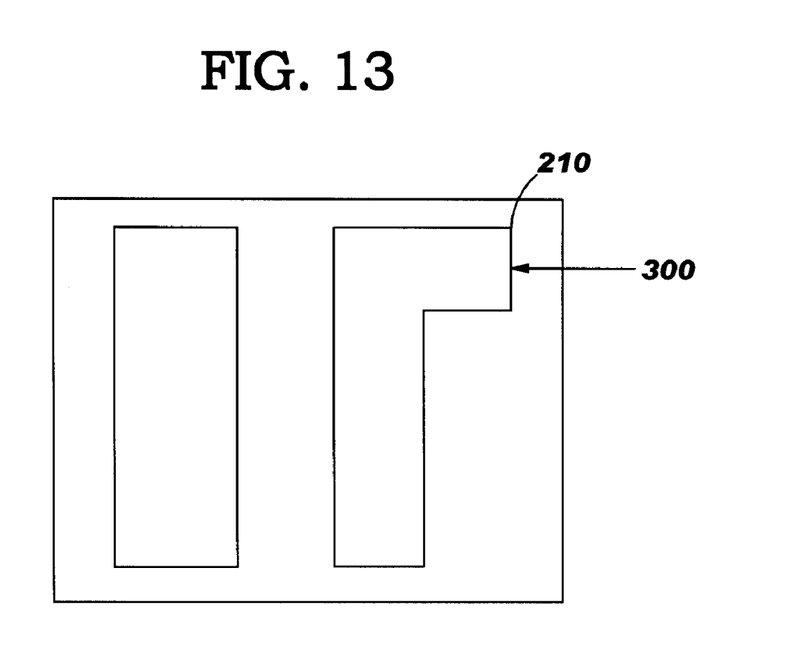
FIG. 13 shows the merger of the original circuit shapes and overlapping clones of FIG. 6 according to the method of the present invention.

In step S2C, a point code (PC) from a plurality of point codes for each clone corner point 202 (FIG. 6) having a previous and next edge orientation is made by point code selector 154 (FIG. 8). In one embodiment, the selection is made by reference to an appropriate shape-direction-specific lookup table, and is based on the previous and next edge orientations. Each "point code" indicates which X coordinate and which Y coordinate of clone corner point(s) 202 and a corresponding original corner point 204 is to be selected to generate a union corner point of union 300 (FIG. 13). That is, which coordinates within a corner point set will be used to generate a union corner point. There are two possibilities for each coordinate: low X for the minimum of low Xs in original circuit shape 22A and clone(s) 22B, 22C; high X for the maximum of Xs in original circuit shape 22A and clone(s) 22B, 22C; low Y for minimum of low Ys in original circuit shape 22A and clone(s) 22B, 22C; and high Y for the maximum of Ys in original circuit shape 22A and clone(s) 22B, 22C.

In one embodiment, there are four possible PCs: high Y, low X (HYLX); high Y, high X (HYHX); low Y, low X (LYLX) and low Y, high X (LYHX). HYLX indicates setting the X coordinate to the lower of the two X coordinates, and setting the Y coordinate to the higher of the two Y coordinates. HYHX indicates setting the X coordinate to the higher of the two X coordinates, and setting the Y coordinate to the higher of the two Y coordinates. LYLX indicates setting the X coordinate to the lower of the two X coordinates, and setting the Y coordinate to the lower of the two Y coordinates. LYHX indicates setting the X coordinate to the higher of the two X coordinates and the Y coordinate to the lower of the two Y coordinates.

In the clockwise (CW) point code (PC) lookup 156 (FIG. 8) that follows, previous edge orientation is provided in the rows and next edge orientation is provided in the columns:

| Next → Previous ↓ | Vertical Up | Vertical Down | Horiz. L to R | Horiz. R to L |
| --- | --- | --- | --- | --- |
| Vertical Up | N/A. | N/A | HYLX | LYLX |
| Vertical Down | N/A | N/A | HYHX | LYHX |
| Horiz. L to R | HYLX | HYHX | N/A | N/A |
| Horiz. R to L | LYLX | LYHX | N/A | N/A |

Each non-empty entry in lookup 156 corresponds to a PC for that original corner point having the corresponding previous edge orientation and next edge orientation. The PC for that corner type identifies which X and Y coordinate will create a union corner point that lies outside the notch created by a mis-registration of that corner type in union 300 (FIG. 13). The new point 'rounds out' the notch created by the mis-registration at this point. In our example above, the point code for original corner point 204A would be HYHX based on its previous edge (206P) orientation H_LtoR, and next edge (206N) orientation V_D.

In the counter-clockwise (CW) point code (PC) lookup 158 (FIG. 8) that follows, previous edge orientation is also provided in the rows and next edge orientation is also provided in the columns:

| Next → Previous ↓ | Vertical Up | Vertical Down | Horiz. L to R | Horiz. R to L |
| --- | --- | --- | --- | --- |
| Vertical Up | N/A | N/A | LYHX | HYLX |
| Vertical Down | N/A | N/A | LYLX | HYHX |
| Horiz. L to R | LYHX | LYLX | N/A | N/A |
| Horiz. R to L | HYHX | HYLX | N/A | N/A |

Figure 12:
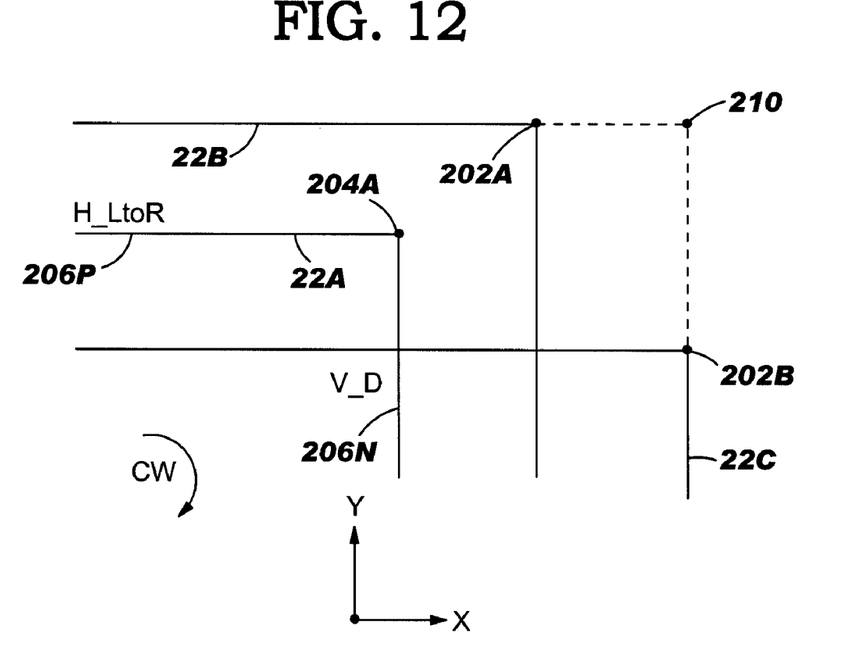
FIG. 12 shows implementation of the methodology of the invention relative to an illustrative original corner point of an original circuit shape having a clockwise shape direction.

In step S2D, respective coordinates of each clone corner point 202 and a corresponding original corner point 204 are compared by comparator/selector 170 (FIG. 8) and an appropriate X coordinate and an appropriate Y coordinate is selected for union 300 (FIG. 13) based on the PC. Where a clone corner point is identical to a corresponding original corner point, the coordinates of original corner point 204 are used to generate union 300 (FIG. 13). Referring to FIG. 12, an exploded view of clone corner points 202A, 202B and corresponding original corner point 204A of FIG. 6 is shown. In this case, the HYHX point code indicates: 1) the highest Y coordinate among clone corner points 202A, 202B of clones 22C, 22B, respectively, and corresponding original corner point 204A of original circuit shape 22A is selected; and 2) the highest X coordinate among clone corner points 202A, 202B and corresponding original corner point 204A is selected. As shown in FIG. 12, clone corner point 202A has the highest Y value, and thus it's Y coordinate value is selected, and clone corner point 202B has the highest X value, and thus it's X coordinate value is selected. This results in a union corner point 210. As indicated, the above sub-step is repeated for each corner point set 208 of original circuit shape 22A until new union corner point(s) for each corner of original circuit shape 22A are known.

In step S2E, union 300 (FIG. 13) is generated by generator 172 (FIG. 8) based on the new union corner point(s) 210. That is, generator 172 connects union corner points 210 to form union 300.

Step S2F represents an optional step of conducting a ground-rule fix-up of union 300 by ground-rule fixer 174 (FIG. 8). The invention assumes that minor modifications (i.e., by a small number of grid points) of the size of the shapes will not substantially change the performance or function of the circuit. However, when the clone merging process is complete, a minimum perturbation (minpert) analysis may be conducted by minpert analyzer 176 (FIG. 8), allowing only the locations of the sub-circuits to change (not the contents). A minpert analysis may be conducted on union 300 by any now known or later developed minpert analyzer (not shown). This step corrects any ground rule error(s) in union 300 by making the minimum number of changes necessary. Implementation of minpert analysis may be similar to that disclosed in U.S. Pat. No. 6,189,132 to Heng et al., which is hereby incorporated by reference for all purposes. This step allows the design to adjust to the small changes in the shapes that result from the clone merging.

As an additional optional step of the ground-rule fix-up step S2F, further modification of the union 300 may also be provided. In particular, a "modify-in-place" procedure may be conducted by ground-rule fixer 174 that includes: taking a cell 200 (FIG. 6), collecting all the relationships of that cell with its surroundings for each placement of that cell, and completing ground-rule fix-up of the cell taking into account all these relationships. In this situation, a "healed" cell is inserted it into all of its environments simultaneously, by combining all of the constraints from neighboring cells and the performing ground-rule fix-up. This creates a system of constraints that takes into account every shape that neighbors any placement of the healed cell. In step S3, union 300 is substituted for original circuit shape and the clones 90 (FIG. 8) in an IC design.

Turning to FIG. 13, union 300 includes legal shapes that completely cover all of the original shape and each of the clones. This new copy of the circuit can be substituted for the original and all the clones relative to further IC design steps, as indicated above. The desired result does not contain unwanted notches. In view of the foregoing, the present invention also includes a union 300 in an IC design that is based on the merger of an original circuit shape and at least one overlapping clone of the original circuit shape where the at least one overlapping clone includes a variation from the original circuit. Union 300 includes a smallest possible polygon enclosing the original shape and the at least one overlapping clone. The smallest possible polygon includes an equal number of vertices as the original shape and edges having the same orientation and order as the original shape. In addition, the smallest possible polygon does not include a notch.

It should be recognized that the teachings of the invention, while described relative to orthogonal circuit shapes may also be applied relative to non-orthogonal circuit shapes by an expansion of point codes. That is, any number of point codes may be implemented to address different edge orientations.

In the previous discussion, it will be understood that the method steps discussed are performed by a processor, such as CPU 114 of system 100, executing instructions of program product 122 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for merging an original circuit shape and at least one overlapping clone of the original circuit shape of an IC design, the method comprising the steps of:
   determining, for a cell including an original circuit shape and at least one overlapping clone of the original circuit shape, whether each clone corner point of each overlapping clone is within a threshold distance of a corresponding original corner point of the original circuit shape; and
   generating, in the case that each clone corner point of each overlapping clone is within the threshold distance, a union of each overlapping clone and the original circuit shape such that the union does not contain a notch.

2. The method of claim 1, wherein the generating step includes:
   determining a shape direction of the original circuit shape;
   determining, for each original corner point of the original circuit shape that has at least one corresponding clone corner point that is not identical to the original corner point, a previous edge orientation and a next edge orientation;
   for each original corner point having a previous and next edge orientation:
   selecting a point code from a plurality of point codes based on the previous and next edge orientations and the shape direction, the point code indicating which X coordinate and which Y coordinate among an original corner point and at least one corresponding clone corner point is selected to generate a union corner point;
   comparing respective coordinates of the original corner point and each corresponding clone corner point and selecting an X coordinate and a Y coordinate for the union corner point based on the point code; and
   generating the union based on any union corner points.

3. The method of claim 2, wherein:
   the previous and next edge orientations are each one of: vertical up, vertical down, horizontal left-to-right (LtoR), and horizontal right-to-left (RtoL);
   the shape direction is one of clockwise and counter-clockwise; and
   the point code includes high Y, low X (HYLX); high Y, high X (HYHX); low Y, low X (LYLX) and low Y, high X (LYHX).

4. The method of claim 3, wherein the shape direction is determined by an order in which points appear in a construction list for the IC design.

5. The method of claim 3, wherein where the shape direction is clockwise, the selected point code is:
   a) for a vertical up previous edge orientation: HYLX for a horizontal LtoR next edge orientation and LYLX for a horizontal RtoL next edge orientation;
   b) for a vertical down previous edge orientation: HYHX for a horizontal LtoR next edge orientation and LYHX for a horizontal RtoL next edge orientation;
   c) for a horizontal LtoR previous edge orientation: HYLX for a vertical up next edge orientations horizontal LtoR and HYHX for a vertical down next edge orientation; and
   d) for a horizontal RtoL previous edge orientation: LYLX for a vertical up next edge orientation and LYHX for a vertical down next edge orientation.

6. The method of claim 3, wherein where the shape direction is counter-clockwise, the selected point code is:

a) for a vertical up previous edge orientation: LYHX for a horizontal LtoR next edge orientation and HYLX for a horizontal RtoL next edge orientation;
b) for a vertical down previous edge orientation: LYLX for a horizontal LtoR next edge orientation and HYHX for a horizontal RtoL next edge orientation;
c) for a horizontal LtoR previous edge orientation: LYHX for a vertical up next edge orientations horizontal LtoR and LYLX for a vertical down next edge orientation; and
d) for a horizontal RtoL previous edge orientation: HYHX for a vertical up next edge orientation and HYLX for a vertical down next edge orientation.

7. The method of claim 2, wherein for each original corner point of the original circuit shape that does not have at least one corresponding clone corner point that is not identical to the original corner point, coordinates of the original corner point are used to generate the union corner point.

8. The method of claim 1, further comprising the step of conducting a ground rule fix-up of the union.

9. The method of claim 1, further comprising the step of substituting the union in the IC design.

10. A system for merging an original circuit shape and at least one clone of the original circuit shape of an IC design, the system comprising:
  means for determining, for a cell including an original circuit shape and at least one overlapping clone of the original circuit shape, whether each clone corner point of each overlapping clone is within a threshold distance of a corresponding original corner point of the original circuit shape; and
  means for generating, in the case that each clone corner point of each overlapping clone is within the threshold distance, a union of each overlapping clone and the original circuit shape such that the union does not contain a notch.

11. The system of claim 10, wherein the generating means includes:
  means for determining a shape direction of the original circuit shape;
  means for determining, for each original corner point of the original circuit shape that has at least one corresponding clone corner point that is not identical to the original corner point, a previous edge orientation and a next edge orientation;
  means for, for each original corner point having a previous and next edge orientation:
    selecting a point code from a plurality of point codes based on the previous and next edge orientations and the shape direction, the point code indicating which X coordinate and which Y coordinate among an original corner point and at least one corresponding clone corner point is selected to generate a union corner point;
    comparing respective coordinates of the original corner point and each corresponding clone corner point and selecting an X coordinate and a Y coordinate for the union corner point based on the point code; and
  means for generating the union based on any union corner points.

12. The system of claim 11, wherein:
  the previous and next edge orientations are each one of: vertical up, vertical down, horizontal left-to-right (LtoR), and horizontal right-to-left (RtoL);
  the shape direction is one of clockwise and counter-clockwise; and
  the point code includes high Y, low X (HYLX); high Y, high X (HYHX); low Y, low X (LYLX) and low Y, high X (LYHX).

13. The system of claim 11, wherein the shape direction determining means determines the shape direction based on an order in which points appear in a construction list for the IC design.

14. The system of claim 10, wherein where the shape direction is clockwise, the selecting means selects the point code to be:
a) for a vertical up previous edge orientation: HYLX for a horizontal LtoR next edge orientation and LYLX for a horizontal RtoL next edge orientation;
b) for a vertical down previous edge orientation: HYHX for a horizontal LtoR next edge orientation and LYHX for a horizontal RtoL next edge orientation;
c) for a horizontal LtoR previous edge orientation: HYLX for a vertical up next edge orientations horizontal LtoR and HYHX for a vertical down next edge orientation; and
d) for a horizontal RtoL previous edge orientation: LYLX for a vertical up next edge orientation and LYHX for a vertical down next edge orientation.

15. The system of claim 11, wherein where the shape direction is counter-clockwise, the selecting means selects the point code to be:
a) for a vertical up previous edge orientation: LYHX for a horizontal LtoR next edge orientation and HYLX for a horizontal RtoL next edge orientation;
b) for a vertical down previous edge orientation: LYLX for a horizontal LtoR next edge orientation and HYHX for a horizontal RtoL next edge orientation;
c) for a horizontal LtoR previous edge orientation: LYHX for a vertical up next edge orientations horizontal LtoR and LYLX for a vertical down next edge orientation; and
d) for a horizontal RtoL previous edge orientation: HYHX for a vertical up next edge orientation and HYLX for a vertical down next edge orientation.

16. A computer program product comprising a computer useable medium having computer readable program code embodied therein when executed performs merging an original circuit shape and at least one clone of the original circuit shape of an IC design, the program product comprising:
  program code configured to determine, for a cell including an original circuit shape and at least one overlapping clone of the original circuit shape, whether each clone corner point of each overlapping clone is within a threshold distance of a corresponding original corner point of the original circuit shape; and
  program code configured to generate, in the case that each clone corner point of each overlapping clone is within the threshold distance, a union of each overlapping clone and the original circuit shape such that the union does not contain a notch.

17. The program product of claim 16, wherein the generating program code includes:
  program code configured to determine a shape direction of the original circuit shape;
  program code configured to determine, for each original corner point of the original circuit shape that has at least one corresponding clone corner point that is not identical to the original corner point, a previous edge orientation and a next edge orientation;

program code configured to, for each original corner point having a previous and next edge orientation:

select a point code from a plurality of point codes based on the previous and next edge orientations and the shape direction, the point code indicating which X coordinate and which Y coordinate among an original corner point and at least one corresponding clone corner point is selected to generate a union corner point;

compare respective coordinates of the original corner point and each corresponding clone corner point and selecting an X coordinate and a Y coordinate for the union corner point based on the point code; and program code configured to generate the union based on any union corner points.

18. The program product of claim 17, wherein:
the previous and next edge orientations are each one of: vertical up, vertical down, horizontal left-to-right (LtoR), and horizontal right-to-left (RtoL);
the shape direction is one of clockwise and counter-clockwise; and
the point code includes high Y, low X (HYLX); high Y, high X (HYHX); low Y, low X (LYLX) and low Y, high X (LYHX).

19. The program product of claim 17, wherein the shape direction determining program code determines the shape direction based on an order in which points appear in a construction list for the IC design.

20. The program product of claim 17, further comprising program code configured to conduct a ground rule fix-up of the union.

* * * * *